US012455586B1

(12) United States Patent
Saeki

(10) Patent No.: US 12,455,586 B1
(45) Date of Patent: Oct. 28, 2025

(54) CURRENT SOURCE CIRCUITS TOLERANT OF TRANSISTOR CHARACTERISTICS VARIATIONS

(71) Applicant: Synaptics Incorporated, San Jose, CA (US)

(72) Inventor: Yutaka Saeki, Kanagawa (JP)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 18/822,942

(22) Filed: Sep. 3, 2024

(51) Int. Cl.
*G05F 3/26* (2006.01)
*G09G 3/20* (2006.01)
*G09G 3/3275* (2016.01)
*H03K 17/687* (2006.01)

(52) U.S. Cl.
CPC ........... *G05F 3/262* (2013.01); *G09G 3/2096* (2013.01); *H03K 17/687* (2013.01); *G09G 3/2007* (2013.01); *G09G 3/3275* (2013.01); *G09G 2310/0291* (2013.01); *G09G 2310/08* (2013.01)

(58) Field of Classification Search
None
See application file for complete search history.

(56) References Cited

U.S. PATENT DOCUMENTS

2006/0238235 A1* 10/2006 Wey ........................ G05F 3/265 327/543
2020/0096818 A1* 3/2020 Chen .................... H05B 45/397

* cited by examiner

*Primary Examiner* — Ifedayo B Iluyomade
(74) *Attorney, Agent, or Firm* — Leydig, Voit & Mayer, Ltd.

(57) ABSTRACT

A current source circuit includes a plurality of current generation subcircuits and an operational amplifier. Each of the plurality of current generation subcircuits includes an output transistor having a drain through which an output constant current is generated, a resistor coupled between a first constant voltage node and a source of the output transistor, and a storage capacitor coupled between the first constant voltage node and a gate of the output transistor. The operational amplifier has a first input coupled to a second constant voltage node, a second input selectively couplable to the source of the output transistor, and an output selectively couplable to the gate of the output transistor.

20 Claims, 12 Drawing Sheets

CURRENT SOURCE CIRCUITS TOLERANT OF TRANSISTOR CHARACTERISTICS VARIATIONS

TECHNICAL FIELD

The present disclosure relates generally to current source circuits, and more particularly to current source circuit configurations that are tolerant of variations in transistor characteristics.

BACKGROUND

Current mirror circuits are commonly used as current sources to provide controlled currents in integrated circuits. Typical current mirror circuits include a set of metal insulator semiconductor field effect transistors (MISFETs), such as metal oxide semiconductor field effect transistors (MOSFETs), with commonly coupled gates. In typical operation, a reference current may be driven through a particular one of the MISFETs to control the voltage level of the commonly coupled gates, causing one or more other MISFETs to generate one or more output mirror currents proportional to the reference current. However, current mirror circuits configured in this manner may suffer from deviations of the output mirror currents from design values due to manufacturing variations in transistor characteristics, such as transistor threshold voltage variations.

SUMMARY

This summary is provided to introduce, in a simplified form, a selection of concepts that are further described below. This summary is not necessarily intended to identify key features or essential features of the present disclosure. The present disclosure may include the following various aspects and embodiments.

In one aspect, the present disclosure provides a current source circuit that includes a plurality of current generation subcircuits and an operational amplifier. Each of the plurality of current generation subcircuits includes an output transistor having a drain through which an output constant current is generated, a resistor coupled between a first constant voltage node and a source of the output transistor, and a storage capacitor coupled between the first constant voltage node and a gate of the output transistor. The operational amplifier has a first input coupled to a second constant voltage node, a second input selectively couplable to the source of the output transistor, and an output selectively couplable to the gate of the output transistor.

In another aspect, the present disclosure provides a display driver that includes a current source circuit and panel drive circuitry. The current source circuit includes a plurality of current generation subcircuits and an operational amplifier. Each of the plurality of current generation subcircuits includes an output transistor having a drain through which an output constant current is generated, a resistor coupled between a first constant voltage node and a source of the output transistor, and a storage capacitor coupled between the first constant voltage node and a gate of the output transistor. The operational amplifier has a first input coupled to a second constant voltage node, a second input selectively couplable to the source of the output transistor, and an output selectively couplable to the gate of the output transistor. The panel drive circuitry is configured to drive a display panel using the output constant currents generated by the plurality of current generation subcircuits.

In yet another aspect, the present disclosure provides a method for operating a current source circuit that includes a plurality of current generation subcircuits. The method includes driving a gate of an output transistor of each of the plurality of current generation subcircuits. Each of the plurality of current generation subcircuits includes a resistor coupled between a first constant voltage node and a source of the output transistor. The driving of the gate of the output transistor of each of the plurality of current generation subcircuits is based on a voltage between a second constant voltage node and the source of the output transistor of each of the plurality of current generation subcircuits. The method further includes holding, by a storage capacitor coupled between the first constant voltage node and the gate of the output transistor in each of the plurality of current generation subcircuits, a gate voltage of the output transistor in each of the plurality of current generation subcircuits. The method further includes generating an output constant current through a drain of the output transistor of each of the plurality of current generation subcircuits.

Other features and aspects are described in more detail below with reference to the attached drawings.

Figure 1:
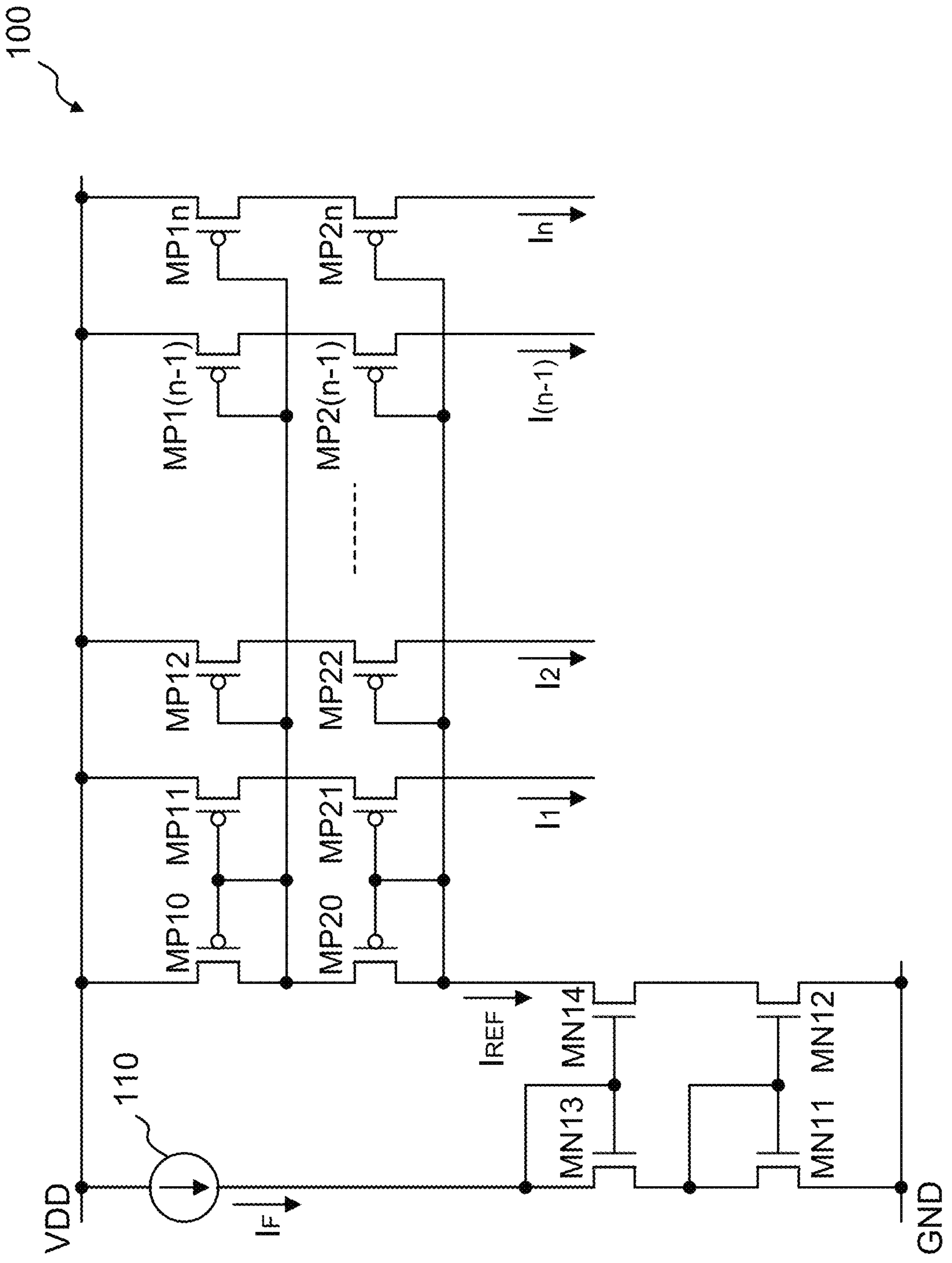
FIG. 1 shows an example current mirror circuit based on a metal oxide semiconductor field effect transistor (MOSFET) technology.

For ease of understanding, where possible, identical reference numerals have been used to designate elements that are common to the figures. It is contemplated that elements disclosed in one embodiment may be utilized in other embodiments without specific recitation. Suffixes may be appended to reference numerals to distinguish elements from one another. The drawings referenced herein are not to be construed as being drawn to scale unless specifically noted. In addition, the drawings are often simplified and details or components are omitted for clarity of presentation and explanation. The drawings and discussion serve to explain principles discussed below.

DETAILED DESCRIPTION

The following detailed description is exemplary in nature and is not intended to limit the disclosure or the applications and uses of the disclosure. Further, there is no intention to be bound by any expressed or implied theory presented in the preceding background, summary and brief description of the drawings, or in the following detailed description.

In the following detailed description, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

The term "coupled" as used herein means connected directly to or connected through one or more intervening components or circuits. Further, throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Current mirror circuits are commonly used as current sources to provide controlled currents (e.g., bias currents and reference currents) in integrated circuits. Typical current mirror circuits based on metal insulator semiconductor field effect transistor (MISFET) technologies include a set of MISFETs (e.g., metal oxide semiconductor field effect transistors (MOSFETs)) having commonly coupled gates. In such current mirror circuits, the voltage level of the commonly coupled gates of the MISFETs may be controlled by a reference current driven through a particular one of the MISFETs to cause the one or more other MISFETs to respectively generate mirrored currents proportional to the reference current.

FIG. 1 shows an example current mirror circuit 100 based on an MOSFET technology. In the shown example, the current mirror circuit 100 includes a constant current source 110, a set of negative channel metal oxide semiconductor field effect transistors (NMOS transistors) MN11, MN12, MN13, and MN14, a first set of positive channel metal oxide semiconductor field effect transistors (PMOS transistors) MP10 to MP1*n*, and a second set of PMOS transistors MP20 to MP2*n*, where n is an integer of two or more. The constant current source 110 is configured to generate a constant current $I_F$, and the NMOS transistors MN11 to MN14 form a current mirror configured to generate a reference current $I_{REF}$ that mirrors the constant current $I_F$.

The PMOS transistors MP10 to MP1*n* have commonly coupled gates coupled to the drain of the PMOS transistor MP10, and the PMOS transistor MP20 to MP2*n* are have commonly coupled gates coupled to the drain of the PMOS transistor MP20. The drains of the PMOS transistors MP10 to MP1*n* are coupled to the sources of the PMOS transistors MP20 to MP2*n*, respectively. In operation, the reference current $I_{REF}$ is applied to the drain of the PMOS transistor MP20 (and also to the drain of PMOS transistor MP10), and the PMOS transistors MP21 to MP2*n* respectively generate mirrored output currents $I_1$ to $I_n$ that are ideally proportional to the reference current $I_{REF}$.

One issue with current mirror circuits based on commonly coupled gate MOSFETs is that such current mirror circuits may experience deviations in output current levels from design values because the current mirror circuits are sensitive to manufacturing variations in transistor characteristics, such as variations in the transistor threshold voltage. With respect to the current mirror circuit 100 shown in FIG. 1, for example, threshold voltage variations of the PMOS transistors MP10 to MP1*n* and MP20 to MP2*n* may cause the current levels of one or more of the mirrored output currents $I_1$ to $I_n$ to deviate from design values. Although adjusting the reference current $I_{REF}$ (e.g. by adjusting the constant current $I_F$) may reduce the deviations of the mirrored output currents $I_1$ to $I_n$ from the design values, adjusting the reference current $I_{REF}$ can only eliminate the deviation with respect to one of the mirrored output currents $I_1$ to $I_n$. Since recent integrated circuit manufacturing processes often suffer from increased threshold voltage variations, the output current level deviations may be an important issue to be addressed. Accordingly, there is a need to provide current source circuits that are tolerant of manufacturing variations in transistor characteristics to provide accurately controlled currents. The present disclosure provides various current source circuit configurations that can provide accurately controlled currents even in the presence of manufacturing variations in transistor characteristics.

Figure 2:
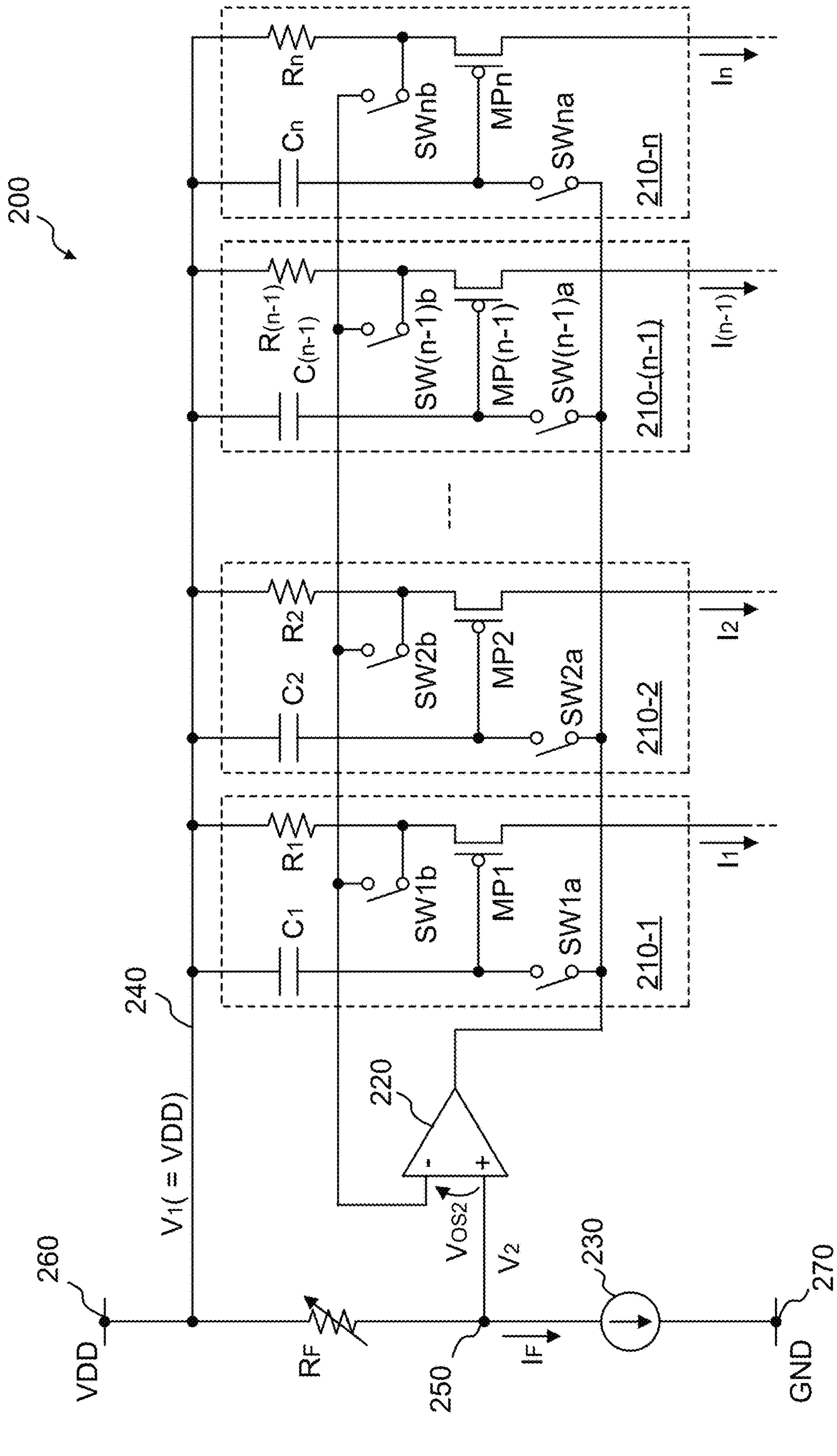
FIG. 2 shows an example configuration of a current source circuit, according to one or more embodiments.

FIG. 2 shows an example configuration of a current source circuit 200, according to one or more embodiments. The current source circuit 200 includes a plurality of current generation subcircuits 210-1 to 210-*n*, an operational amplifier 220, a constant current source 230, and a variable transistor $R_F$.

The current generation subcircuits 210-1 to 210-*n* are configured to generate output constant currents $I_1$ to $I_n$, respectively, each of which is a mirror current of a constant reference current $I_F$ generated by the constant current source 230. In the shown embodiment, the current generation subcircuits 210-1 to 210-*n* are configured to provide the output constant currents $I_1$ to $I_n$ to one or more external circuits. Each current generation subcircuit 210-*i* includes a PMOS transistor MPi, a resistor $R_i$, a storage capacitor $C_i$, switches SWia and SWib, where i is any integer between 1 and n, inclusive. The resistor $R_i$ is coupled between a first constant voltage node 240 and the source of the PMOS transistor MPi, and the storage capacitor $C_i$ is coupled between the first constant voltage node 240 and the gate of the PMOS transistor MPi, wherein the first constant voltage node 240 is a node to which a constant voltage $V_1$ is provided. In the embodiment shown in FIG. 2, the first constant voltage node 240 is coupled to a power node 260, and therefore the constant voltage $V_1$ is equal to a power source voltage VDD that is provided to the power node 260 from a power supply. The switch SWia is coupled between the gate of the PMOS transistor MPi and the output of the operational amplifier 220, and the switch SWib is coupled between the source of the PMOS transistor MPi and one of the two inputs (e.g., an inverting input) of the operational amplifier 220.

The variable register RF is coupled between the first constant voltage node 240 and a node 250, and the constant current source 230 is coupled between the node 250 and a grounded node 270. The constant current source 230 is configured to generate a constant current $I_F$ through the variable register RF by drawing the constant current $I_F$ from the node 250, thereby generating a constant voltage $V_2$ at the node 250. Since the constant voltage $V_2$ is generated at the node 250, the node 250 may also be referred to as second constant voltage node 250.

The operational amplifier 220 is operatively coupled to each of the current generation subcircuits 210-1 to **210-*n*. More specifically, one of the two inputs (e.g., the inverting input) of the operational amplifier 220 is selectively couplable to the sources of the PMOS transistors MP1 to MPn by the switches SW1*b* to SWnb, respectively, and the other input (e.g., the non-inverting input) of the operational amplifier 220 is coupled to the second constant voltage node 250. Further, the output of the operational amplifier 220 is selectively couplable to the gates of the PMOS transistors MP1 to MPn by the switches SW1*a* to SWna, respectively. With such connections, the operational amplifier 220 is used to control the gate voltages (or the voltage levels at the gates) of the PMOS transistors MP1 to MPn of the respective current generation subcircuits 210-1 to 210-*n***.

Figure 3:
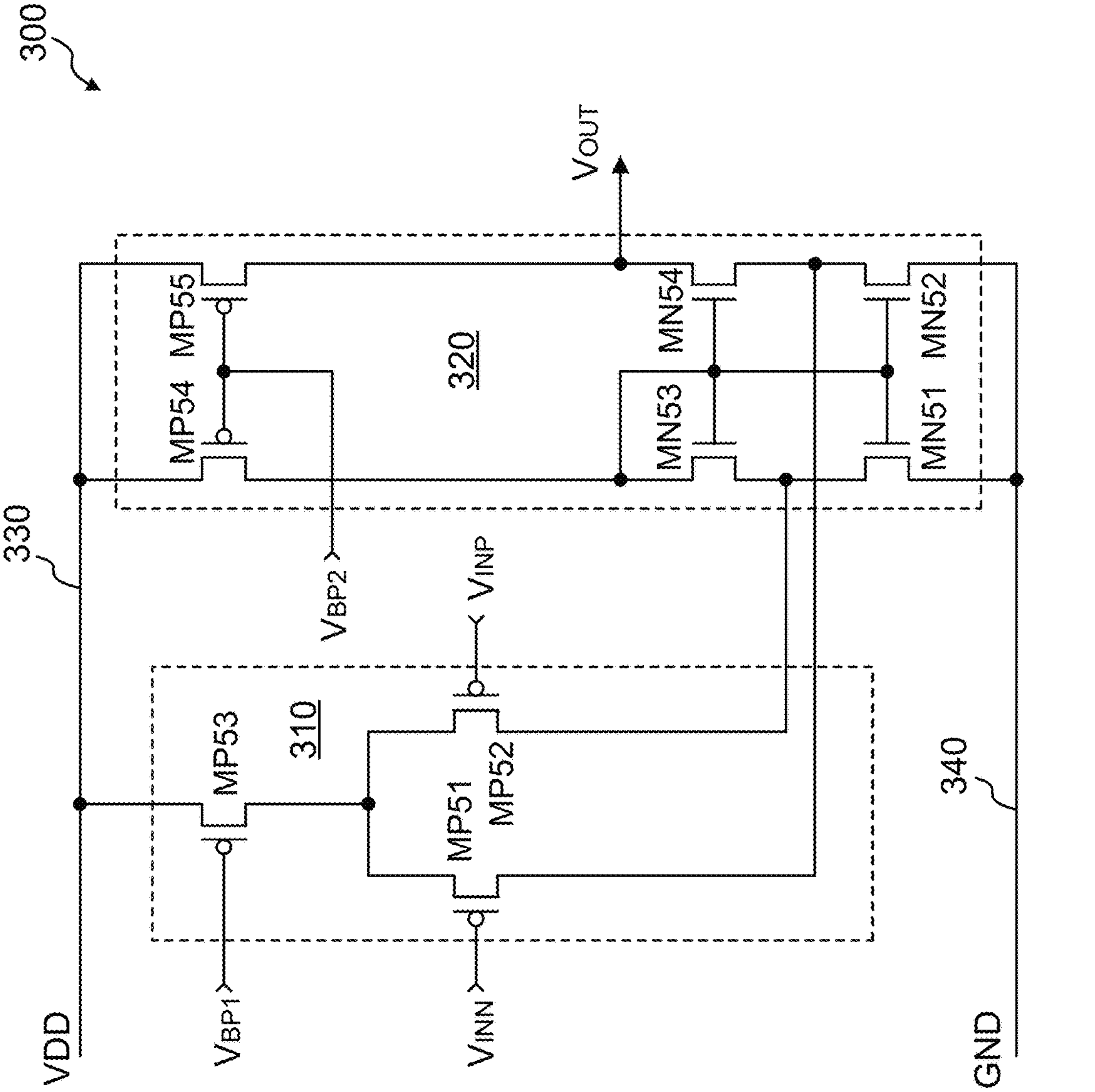
FIG. 3 shows the configuration of an example operational amplifier, according to one or more embodiments.

FIG. 3 shows the configuration of an example operational amplifier 300, which is one embodiment of the operational amplifier 220 shown in FIG. 2. The operational amplifier 300 is configured to output an output voltage $V_{OUT}$ in response to the difference between an inverting input voltage $V_{INN}$ and a non-inverting input voltage $V_{INP}$. The operational amplifier 300 includes an input stage 310 and an active load circuit 320. The input stage 310 includes PMOS transistors MP51, MP52, and MP53. The PMOS transistor MP51 has a gate that receives the inverting input voltage $V_{INN}$ from the inverting input of the operational amplifier 300, and the PMOS transistor MP52 has a gate that receives the non-inverting input voltage $V_{INP}$ from the non-inverting input. The sources of the PMOS transistors MP51 and MP52 are commonly coupled to the drain of the PMOS transistor MP53, and the drains of the PMOS transistors MP51 and MP52 are coupled to the active load circuit 320 to provide a pair of currents depending on the difference between the inverting and non-inverting input voltages $V_{INN}$ and $V_{INP}$. The PMOS transistor MP53 has a source coupled to a power node 330 that receives the power source voltage VDD and a gate that receives a constant bias voltage $V_{BP1}$. The PMOS transistor MP53 is configured to provide a constant current to the commonly coupled sources of the PMOS transistors MP51 and MP52.

The active load circuit 320 is configured to output the output voltage $V_{OUT}$ in response to the currents received from the PMOS transistors MP51 and MP52 of the input stage 310. The active load circuit 320 includes PMOS transistors MP54 and MP55, and NMOS transistors MN51, MN52, MN53, and MN54. The PMOS transistors MP54 and MP55 have commonly coupled sources coupled to the power node 330 and commonly coupled to gates that receives a constant bias voltage $V_{BP2}$. The NMOS transistors MN51, MN52, MN53, and MN54 form a cascaded current mirror. The sources of the NMOS transistors MN51 and MN52 are commonly coupled to a grounded node 340, and the drains of the NMOS transistors MN51 and MN52 are coupled to the sources of the NMOS transistors MN53 and MN54, respectively. The drains of the NMOS transistors MN51 and MN52 are further coupled to the drains of the PMOS transistors MP52 and MP51 of the input stage 310, respectively. The drains of the NMOS transistors MN53 and MN54 are coupled to the drains of the PMOS transistors MP54 and MP55, respectively. The gates of the NMOS transistors MN51, MN52, MN53, and MN54 are commonly coupled to the drain of the NMOS transistor MN53. The output voltage $V_{OUT}$ is output from an intermediate node connecting the drains of the PMOS transistor MP55 and the NMOS transistor MN54.

Figure 4:
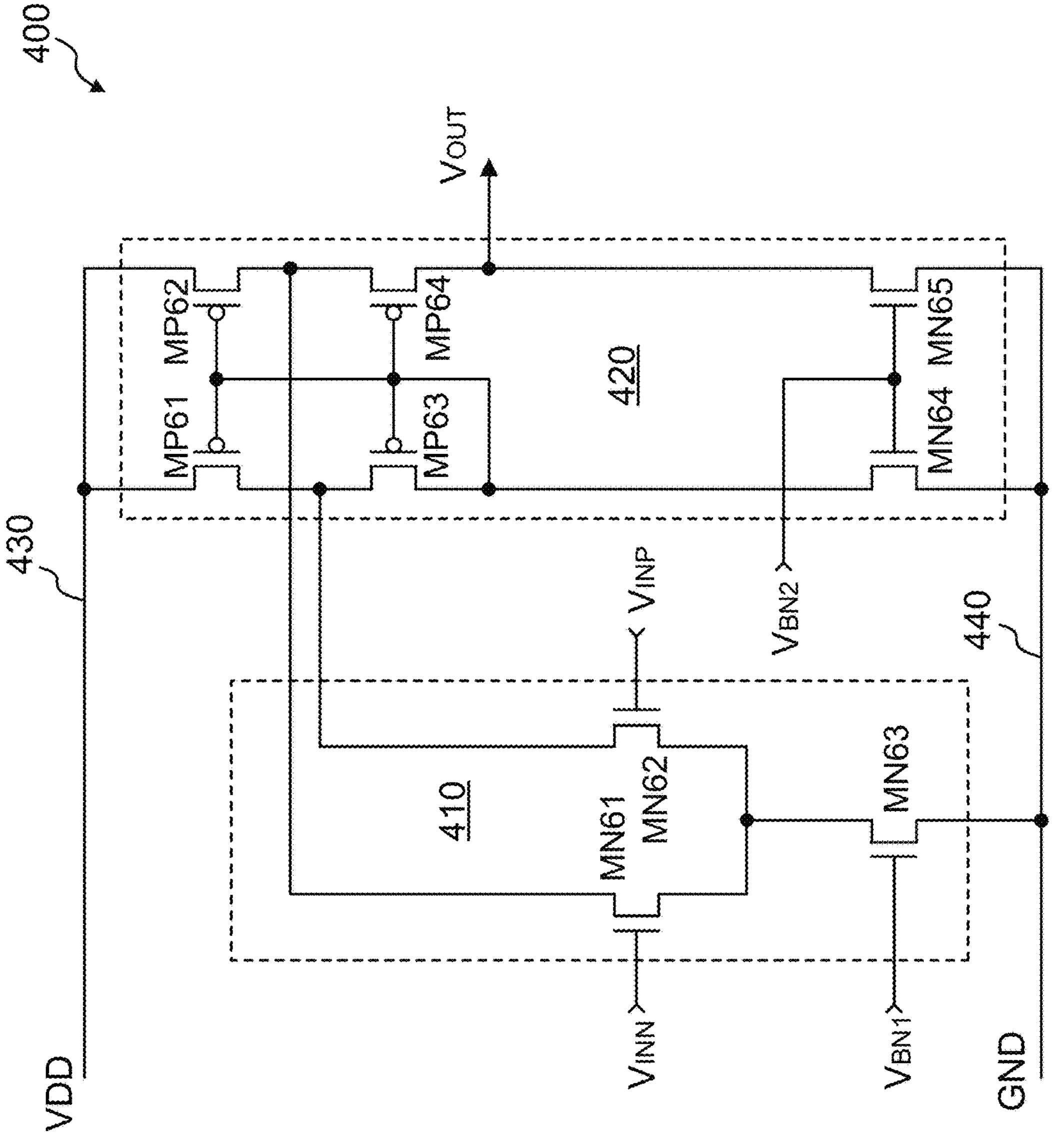
FIG. 4 shows the configuration of another example operational amplifier, according to one or more embodiments.

FIG. 4 shows the configuration of another example operational amplifier 400, which is another embodiment of the operational amplifier 220 shown in FIG. 2. The operational amplifier 400 is a version of the operational amplifier 300 shown in FIG. 3 in which the transistor channels are reversed in polarity. The operational amplifier 400 includes an input stage 410 and an active load circuit 420. The input stage 410 includes NMOS transistors MN61, MN62, and MN63. The NMOS transistor MN61 has a gate that receives the inverting input voltage $V_{INN}$ from the inverting input of the operational amplifier 400, and the NMOS transistor MN62 has a gate that receives the non-inverting input voltage $V_{INP}$ from the non-inverting input. The sources of the NMOS transistors MN61 and MN62 are commonly coupled to the drain of the NMOS transistor MN63, and the drains of the NMOS transistors MN61 and MN62 are coupled to the active load circuit 420 to draw a pair of currents depending on the difference between the inverting and non-inverting input voltages $V_{INN}$ and $V_{INP}$. The NMOS transistor MN63 has a source coupled to a grounded node 440 and a gate that receives a constant bias voltage $V_{BN1}$. The NMOS transistor MN63 is configured to draw a constant current from the commonly coupled sources of the NMOS transistors MP61 and MP62.

The active load circuit 420 is configured to output the output voltage $V_{OUT}$ in response to the currents drawn by the NMOS transistors MN61 and MN62 of the input stage 410. The active load circuit 420 includes NMOS transistors MN64 and MN65 and PMOS transistors MP61, MP62, MP63, and MP64. The PMOS transistors MN64 and MN65 have commonly coupled sources coupled to the grounded node 440 and commonly coupled to gates that receives a constant bias voltage $V_{BN2}$. The PMOS transistors MP61, MP62, MP63, and MP64 form a cascaded current mirror. The sources of the PMOS transistors MP61 and MP62 are commonly coupled to a power node 430 that receives the power source voltage VDD, and the drains of the PMOS transistors MP61 and MP62 are coupled to the sources of the PMOS transistors MP63 and MP64, respectively. The drains of the PMOS transistors MP61 and MP62 are further coupled to the drains of the NMOS transistors MN62 and MN61 of the input stage 410, respectively. The drains of the PMOS transistors MP63 and MP64 are coupled to the drains of the NMOS transistors MN64 and MN65, respectively. The gates of the PMOS transistors MP61, MP62, MP63, and MP64 are commonly coupled to the drain of the PMOS transistor MP63. The output voltage $V_{OUT}$ is output from an intermediate node that connecting the drains of the NMOS transistor MN65 and the PMOS transistor MP64.

Referring back to FIG. 2, the operational amplifier 220 is configured to, when the switches SWia and SWib are turned on (e.g., closed), drive the gate of the PMOS transistor MPi of each current generation subcircuit **210-*i* in response to the voltage between the source of the PMOS transistor MPi and the second constant voltage node 250, thereby charging the storage capacitor $C_i$ with the voltage between the gate of the PMOS transistor MPi and the first constant voltage node 240**. The gate of the PMOS transistor MPi is driven to a gate voltage that causes the PMOS transistor MPi to generate the output constant current $I_i$ of a desired level, thereby charging the storage capacitor $C_i$ with a voltage that allows the storage capacitor $C_i$ to maintain the gate voltage of the PMOS transistor MPi. When the switches SWia and SWib are then turned off (e.g., opened), the storage capacitor $C_i$ holds the gate voltage of the PMOS transistor MPi to allow the PMOS transistor MPi to maintain the current level of the output constant current $I_i$.

Figure 5A:
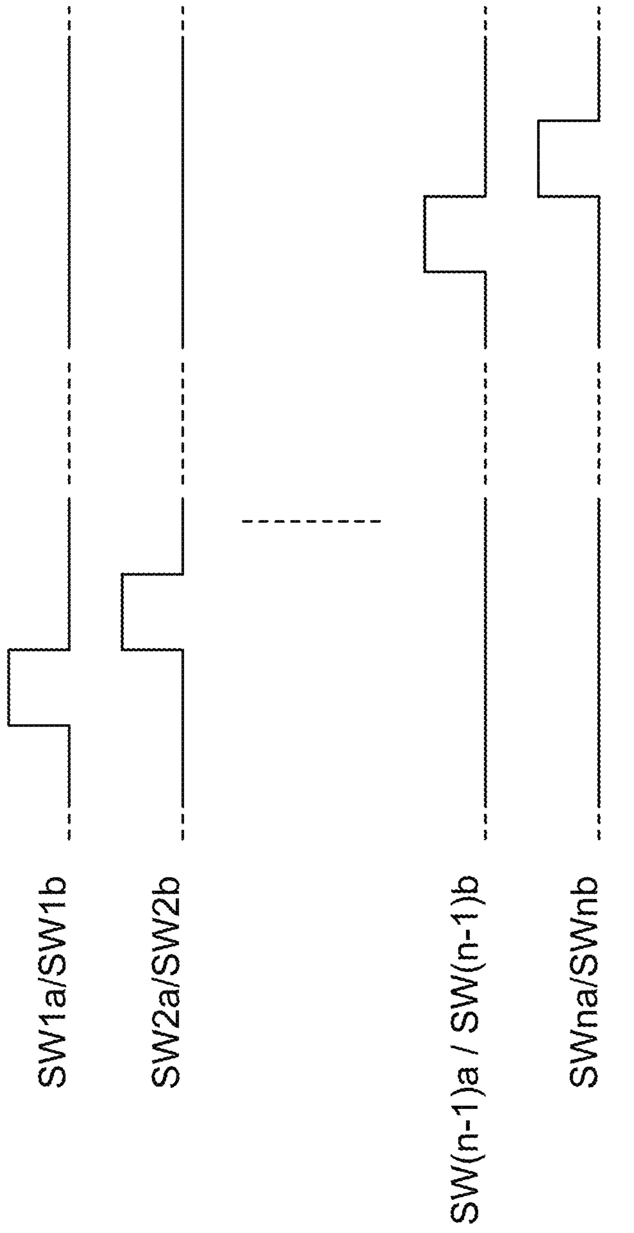
FIG. 5A shows an example of the operation of switches in current generation subcircuits, according to one or more embodiments.

FIG. 5A shows an example of the operation of the switches SW1*a* to SWna and SW1*b* to SWnb of the current generation subcircuits 210-1 to 210-*n*, according to one or more embodiments. It should be noted that FIG. 5A shows one iteration of the operation of the switches SW1*a* to SWna and SW1*b* to SWnb, and those skilled in the art would appreciate that the operation shown in FIG. 5A may be repeated regularly or irregularly. In the embodiment shown in FIG. 5A, the switches SW1*a* to SWna are turned on (e.g., closed) in turn and the switches SW1*b* to SWnb are turned on (e.g., closed) in turn, while the switches SWia and SWib are turned on simultaneously in each current generation subcircuit 210-*i*. Turning on (e.g., closing) the switches SWia and SWib allows the operational amplifier 220 to drive the gate of the PMOS transistor MPi and charge the storage capacitor $C_i$ to maintain the gate voltage of the PMOS transistor MPi. When the switches SWia and SWib are turned off (e.g., opened), the output of the operational amplifier 220 is disconnected from the gate of the PMOS transistor MPi, and the storage capacitor $C_i$ holds the gate voltage of the PMOS transistor MPi. By repeatedly performing the operation shown in FIG. 5A, the gate voltage of the PMOS transistors MP1 to MPn is maintained to allow the PMOS transistors MP1 to MPn to generate the output constant currents $I_1$ to $I_n$ at desired current levels.

Figure 5B:
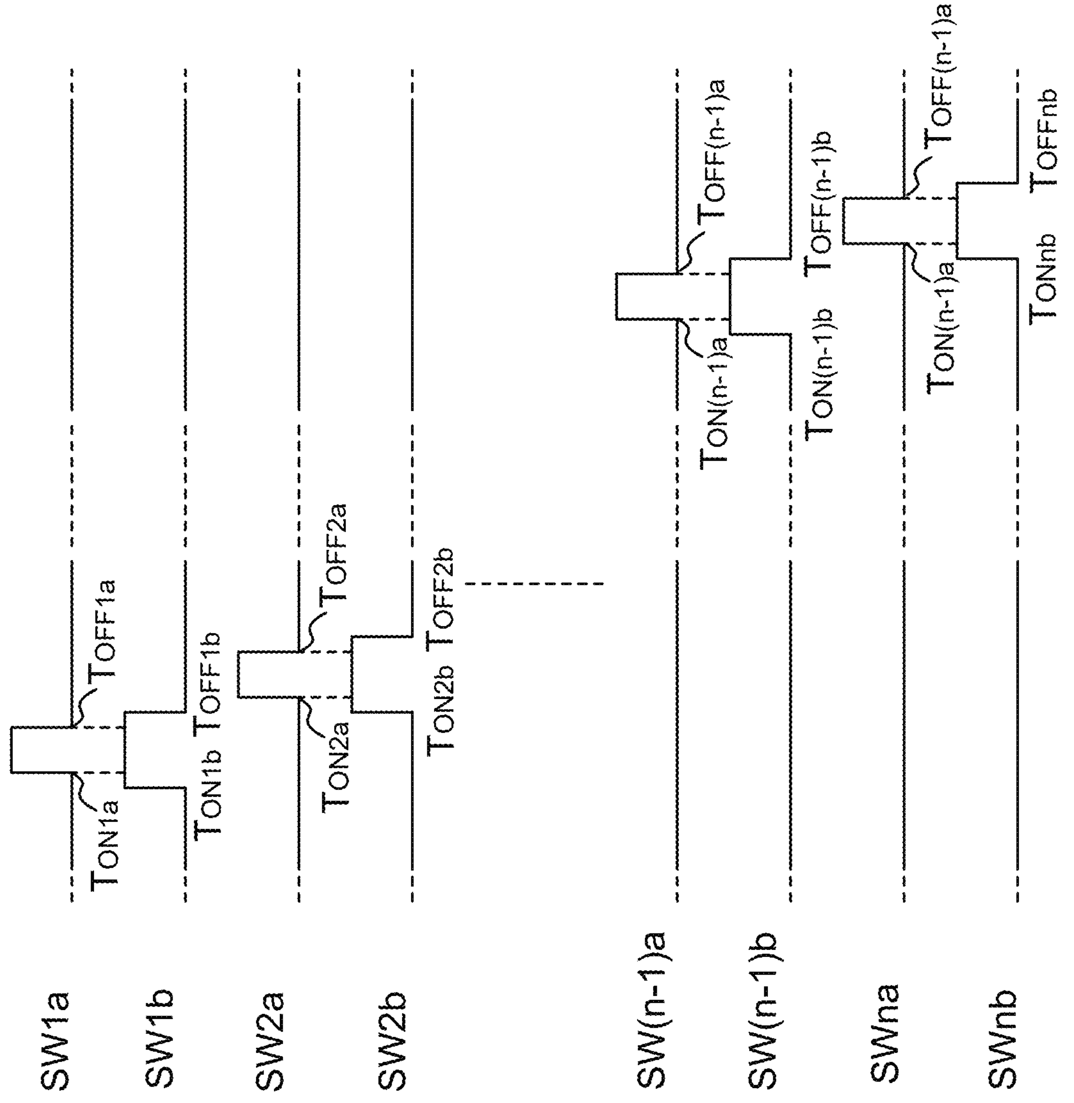
FIG. 5B shows an example of the operation of switches in current generation subcircuits, according to one or more embodiments.

FIG. 5B shows another example of the operation of the switches SW1*a* to SWna and SW1*b* to SWnb, according to one or more embodiments. It should be noted that FIG. 5B shows one iteration of the operation of the switches SW1*a* to SWna and SW1*b* to SWnb, and those skilled in the art would appreciate that the operation shown in FIG. 5B may be repeated regularly or irregularly. In the embodiment shown in FIG. 5B, the switches SWia and SWib are turned on and off (e.g., closed and opened, respectively) at different timing in each current generation subcircuit 210-*i*. More specifically, in each iteration, the switch SWib is turned on (e.g., closed) during a period from time $T_{ONib}$ to time $T_{OFFib}$ and the switch SWia is turned on (e.g., closed) during a period from time $T_{ONia}$ to time $T_{OFFib}$, where time $T_{ONia}$ occurs after time $T_{ONib}$ and time $T_{OFFia}$ occurs before time $T_{OFFib}$. The turn-on period of the switch SWia begins after the start of the turn-on period of the switch SW1*b*, and the turn-on period of the switch SWia ends before the end of the turn-on period of the switch SW1*b*. The operation shown in FIG. 5B provides a timing margin to ensure that the operational amplifier 220 drives the gate of the PMOS transistor MPi and charges the storage capacitor $C_i$ only while the inverting input of the operational amplifier 220 is electrically connected to the source of the PMOS transistor MPi. The operation shown in FIG. 5B effectively improves the operational reliability of the current source circuit 200 to stably generate the output constant currents $I_1$ to $I_n$.

Referring again to FIG. 2, one advantageous feature of the current source circuit 200 shown in FIG. 2 is that the current source circuit 200 is tolerant of manufacturing variations in the transistor characteristics, such as variations in the transistor threshold voltage. The current source circuit 200 can generate the output constant currents $I_1$ to $I_n$ with high accuracy even in the existence of manufacturing variations in the transistor characteristics of the PMOS transistors MP1 to MPn, as discussed below.

As a result of the operation of the operational amplifier 220, the following relationship applies with respect to the resistances of the resistors $R_1$ to $R_n$ and the current levels of the output constant currents $I_1$ to $I_n$:

$$R_1 \times I_1 = R_2 \times I_2 = \ldots = R_{n-1} \times I_{n-1} = R_n \times I_n = V_1 - (V_2 + V_{OS2}), \quad (1)$$

where $V_1$ is the voltage level at the first constant voltage node 240, $V_2$ is the voltage level at the second constant voltage node 250, and $V_{OS2}$ is the offset voltage between the inverting and non-inverting inputs of the operational amplifier 220. It should be noted that although the offset voltage $V_{OS2}$ would be zero if the operational amplifier 220 were operating ideally, the offset voltage $V_{OS2}$ might not be zero during actual operations. Since the voltage of $V_1$-$V_2$ is applied to the variable resistor $R_F$, expression (1) can be written as follows:

$$R_1 \times I_1 = R_2 \times I_2 = \ldots = R_{n-1} \times I_{n-1} = R_n \times I_n = R_F \times I_F - V_{OS2}. \quad (2)$$

As can be seen from expression (2), one of the output constant currents $I_1$ to $I_n$ can be set to its desired value by adjusting the resistance of the variable resistor $R_F$, and the remaining output constant currents can be set to their desired values by adjusting the resistances of the resistors $R_1$ to $R_n$. Note that expression (2) is independent of the transistor characteristics (e.g., the transistor threshold voltages), which indicates that the output constant currents $I_1$ to $I_n$ are essentially free from the effects of manufacturing variations in the transistor characteristics (e.g., variations in the transistor threshold voltage).

The present disclosure also recognizes that modern MOSFET manufacturing processes typically produce only negligible variations in the resistances of resistive elements, such as polysilicon resistors and diffusion resistors. Although expression (2) indicates that manufacturing variations in the resistances of the resistive elements may cause the current levels of the output constant currents $I_1$ to $I_n$ to deviate from design values, in embodiments where the current source circuit 200 is fabricated using a modern MOSFET manufacturing process, the output constant currents $I_1$ to $I_n$ are substantially free from the effects of the manufacturing variations in the resistances of the resistive elements.

In one implementation, the output constant current $I_1$ may be adjusted to be equal to the reference current $I_F$ by adjusting the resistance of the variable resistor $R_F$. In this case, the output constant currents $I_2$ to $I_n$ are represented as follows:

$$I_2 = \frac{R_1}{R_2} \times I_F, \quad (3)$$
$$\vdots$$
$$I_{n-1} = \frac{R_1}{R_{n-1}} \times I_F, \text{ and}$$
$$I_n = \frac{R_1}{R_n} \times I_F.$$

These expressions indicate that the output constant currents $I_2$ to $I_n$ can be adjusted by the resistances of the resistors $R_1$ to $R_n$. In embodiments where the resistances of all of the resistors $R_1$ to $R_n$ are equal, all of the output constant currents $I_1$ to $I_n$ are equal to the reference current $I_F$. In other embodiments, the output constant current $I_1$ can be set to a desired current level different from that of the reference current $I_F$. Also in such embodiments, the output constant currents $I_2$ to $I_n$ can be set to desired values by adjusting the resistances of the resistors $R_1$ to $R_n$.

Figure 6:
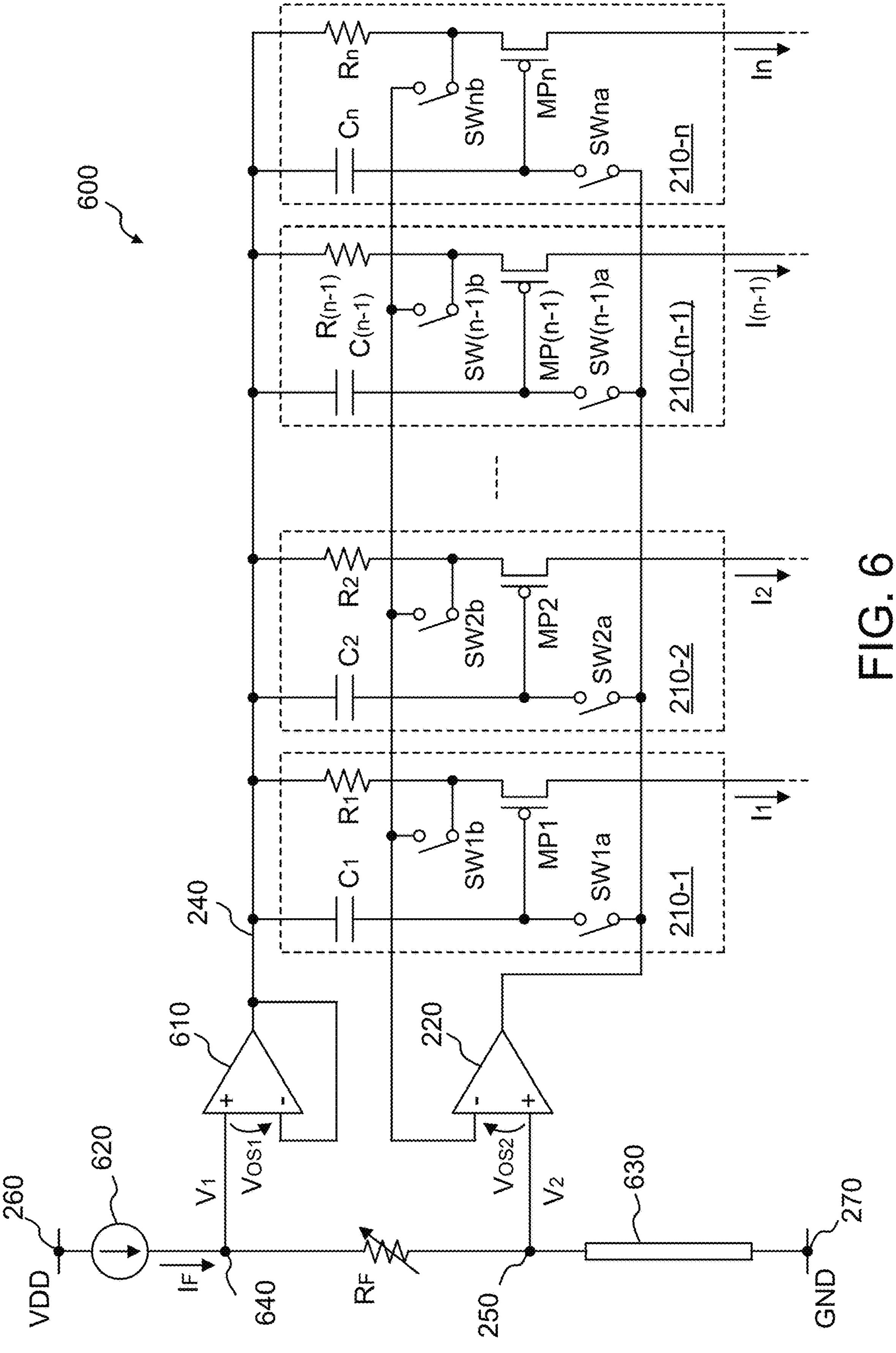
FIG. 6 shows an example configuration of a current source circuit, according to other embodiments.

FIG. 6 shows an example configuration of a current source circuit 600, according to other embodiments. In FIG.

6, the same numerals as in FIG. 2 are used to designate the same components as described above. The current source circuit 600 includes an operational amplifier 610, a constant current source 620, and a load element 630. The operational amplifier 610 is configured to regulate the voltage level at the first constant current node 240. One of the two inputs (e.g., the inverting input) of the operational amplifier 610 is coupled to the output of the operational amplifier 610 and the other of the two inputs (e.g., the non-inverting input) is coupled to a third constant voltage node 640. The output of the operational amplifier 610 is coupled to the first constant current node 240. The variable resistor RF is coupled between the third constant voltage node 640 and the second constant voltage node 250, and the load element 630 is coupled between the second constant voltage node 250 and the grounded node 270. The constant current source 620 is configured to generate a reference current $I_F$ through the variable resistor RF and the load element 630 to generate a constant voltage $V_2$ at the second constant voltage node 250 and a constant voltage $V_1$ at the third constant voltage node 640. The voltage level $V_1$ at the third constant voltage node 640 is greater than the voltage level $V_1$ at the second constant voltage node 250.

The current source circuit 600 of FIG. 6 is configured to generate the output constant currents $I_1$ to $I_n$ by operating the switches SW1*a* to SWna and SW1*b* to SWnb as shown in FIG. 5A or 5B. As is the case with the current source circuit 200 of FIG. 2, the current source circuit 600 can generate the output constant currents $I_1$ to $I_n$ with high accuracy, because the output constant currents $I_1$ to $I_n$ are substantially free from the effects of manufacturing variations in the transistor characteristics, such as transistor threshold voltage variations. More specifically, the following relationship applies to the current source circuit 600 with respect to the resistances of the resistors $R_1$ to $R_n$ and the current levels of the output constant currents $I_1$ to $I_n$:

$$R_1 \times I_1 = R_2 \times I_2 = \ldots = R_{n-1} \times I_{n-1} = R_n \times I_n = (V_1 + V_{OS1}) - (V_2 + V_{OS2}), \quad (4)$$

where $V_1$ is the voltage level at the third constant voltage node 640, $V_2$ is the voltage level at the second constant voltage node 250, $V_{OS1}$ is the offset voltage between the inverting and non-inverting inputs of the operational amplifier 610, and $V_{OS2}$ is the offset voltage between the inverting and non-inverting inputs of the operational amplifier 220. It should be noted that although the offset voltages $V_{OS1}$ and $V_{OS2}$ would be zero if the operational amplifiers 220 and 610 were operating ideally, the offset voltages $V_{OS1}$ and $V_{OS2}$ might not be zero during actual operations. Since the voltage of $V_1$-$V_2$ is applied to the variable resistor $R_F$, expression (4) can be written as follows:

$$R_1 \times I_1 = R_2 \times I_2 = \ldots = R_{n-1} \times I_{n-1} = R_n \times I_n = R_F \times I_F + V_{OS1} - V_{OS2}. \quad (5)$$

As can be seen from the discussion of expression (2), expression (5) also implies that one of the output constant currents $I_1$ to $I_n$ can be set to its desired value by adjusting the resistance of the variable resistor $R_F$, and the remaining output constant currents can be set to their desired values by adjusting the resistances of the resistors $R_1$ to $R_n$. Since expression (5) is independent of the transistor characteristics, the output constant currents $I_1$ to $I_n$ are substantially free from the effect of manufacturing variations in the transistor characteristics, such as variations in the transistor threshold voltage. In other words, the current source circuit 600 is tolerant of manufacturing variations in the transistor characteristics. Further, the current source circuit 600 is also tolerant of variations in the power source voltage VDD provided to the power node 260 because the voltage level at the first constant voltage node 240 is actively regulated by the operational amplifier 610.

Figure 7:
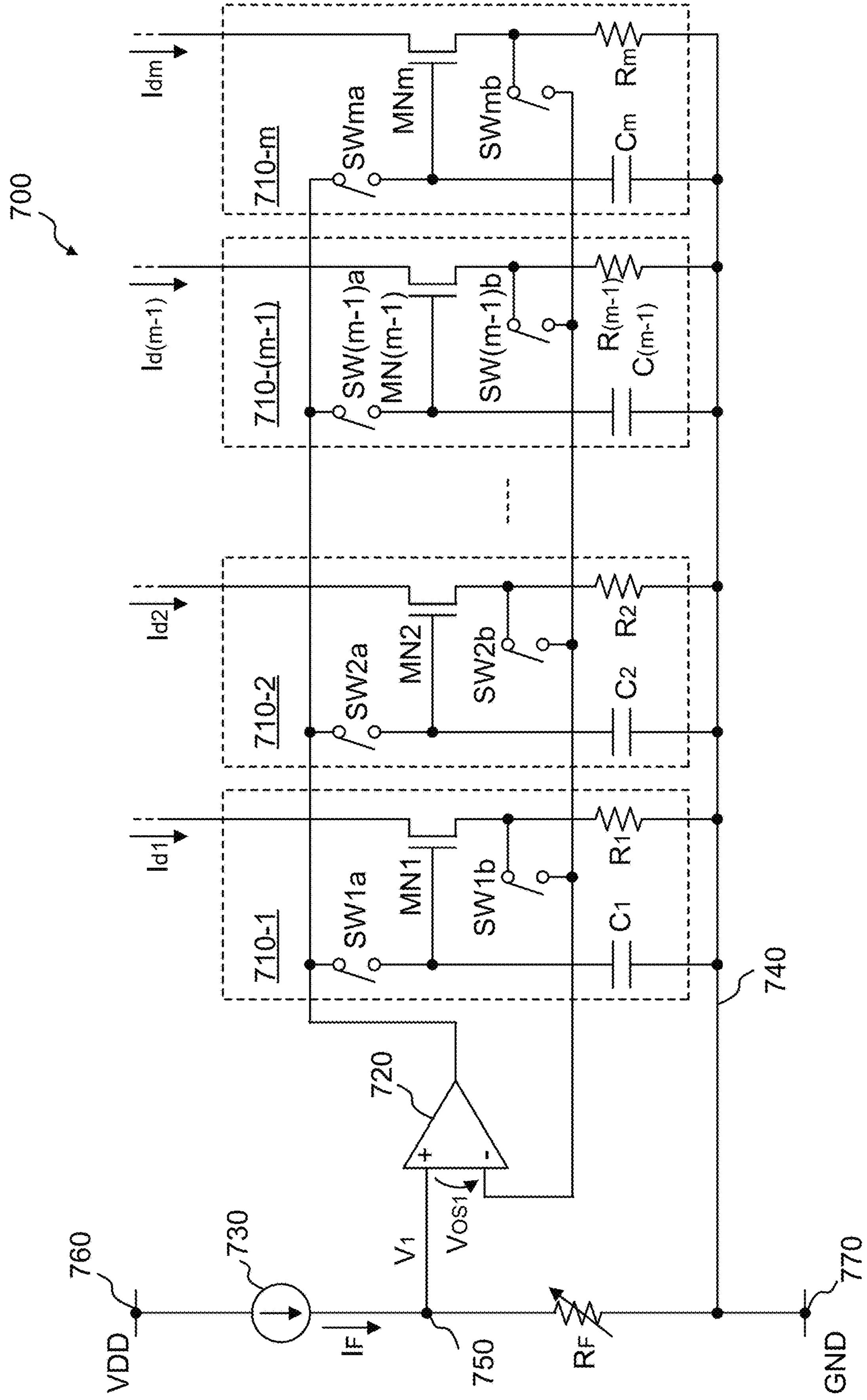
FIG. 7 shows an example configuration of a current source circuit, according to still other embodiments.

FIG. 7 shows an example configuration of a current source circuit 700, according to still other embodiments. The current source circuit 700 is a version of the current source circuit 200 shown in FIG. 2 in which the transistor channels in the current generation subcircuits are reversed in polarity. The current source circuit 700 includes a set of current generation subcircuits 710-1 to 710-*m*, an operational amplifier 720, a constant current source 730, and a variable transistor $R_F$, where m is an integer of two or more.

The current generation subcircuits 710-1 to 710-*m* are configured to generate output constant currents $I_{d1}$ to $I_{dm}$, respectively, each of which is a mirror current of a constant reference current $I_F$ generated by the constant current source 730. In the shown embodiments, the current generation subcircuits 710-1 to 710-*m* are configured to draw the output constant currents $I_{d1}$ to $I_{dm}$ from one or more external circuits. Each current generation subcircuit 710-*j* includes an NMOS transistor MNj, a resistor $R_i$, a storage capacitor $C_j$, switches SWja and SWjb, where j is any integer between 1 and m, inclusive. The resistor $R_j$ is coupled between a first constant voltage node 740 and the source of the NMOS transistor MNj, and the storage capacitor $C_j$ is coupled between the first constant voltage node 740 and the gate of the NMOS transistor MNj, wherein the first constant voltage node 740 is a node to which a constant voltage is provided. In the embodiment shown in FIG. 7, the first constant voltage node 740 is coupled to a grounded node 770, and therefore the voltage level of the first constant voltage node 740 is zero or the ground voltage GND. The switch SWja is coupled between the gate of the NMOS transistor MNj and the output of the operational amplifier 720, and the switch SWjb is coupled between the source of the NMOS transistor MNj and one of the two inputs (e.g., an inverting input) of the operational amplifier 720.

The variable register RF is coupled between the first constant voltage node 740 and a second constant voltage node 750, and the constant current source 730 is coupled between the second constant voltage node 750 and a power node 760 to which a power source voltage VDD is provided from a power source. The constant current source 730 is configured to generate a constant current $I_F$ through the variable register RF by providing the constant current $I_F$ to the second constant voltage node 750, thereby generating a constant voltage $V_1$ at the second constant voltage node 750.

The operational amplifier 720 is configured to, when the switches SWja and SWjb are turned on (e.g., closed), drive the gate of the NMOS transistor MNj of each current generation subcircuit 710-*j* in response to the voltage between the source of the NMOS transistor MNj and the second constant voltage node 750, thereby charging the storage capacitor $C_j$ with the voltage between the gate of the NMOS transistor MNj and the first constant voltage node 740. The gate of the NMOS transistor MNj is driven to a gate voltage that causes the NMOS transistor MNj to generate the output constant current $I_j$ at a desired level, thereby charging the storage capacitor $C_j$ with a voltage that allows the storage capacitor $C_j$ to maintain the gate voltage of the NMOS transistor MNj. When the switches SWja and SWjb are then turned off (e.g., opened), the storage capacitor $C_j$ holds the gate voltage of the NMOS transistor MNj to allow the NMOS transistor MNj to maintain the current level of the output constant current $I_j$.

The current source circuit 700 of FIG. 7 is configured to generate the output constant currents $I_1$ to $I_n$ in a manner similar to the current source circuits 200 and 600 shown in FIGS. 2 and 6, respectively, by turning on (e.g., closing) the switches SW1*a* to SWma and SW1*b* to SWmb in turn in a manner similar to that shown in FIG. 5A or 5B. As a result, the current source circuit 700 generates the output constant currents $I_{d1}$ to $I_{dm}$ such that the output constant currents $I_{d1}$ to $I_{dm}$ are substantially free from the effect of manufacturing variations in the transistor characteristics, such as transistor threshold voltage variations as discussed below. More specifically, the following relationship applies to the current source circuit 700 with respect to the resistances of the resistors $R_1$ to $R_n$ and the current levels of the output constant currents $I_{d1}$ to $I_{dm}$:

$$R_1 \times I_{d1} = R_2 \times I_{d2} = \ldots = R_{m-1} \times I_{d(m-1)} = R_m \times I_{dm} = V_1 + V_{OS1}, \tag{6}$$

where $V_1$ is the voltage level at the second constant voltage node 750, and $V_{OS1}$ is the offset voltage between the inverting and non-inverting inputs of the operational amplifier 720. It should be noted that although the offset voltage $V_{OS1}$ would be zero if the operational amplifier 720 were operating ideally, the offset voltage $V_{OS1}$ might not be zero during actual operations. Since the voltage of $V_1$ is applied to the variable resistor $R_F$, expression (6) can be written as follows:

$$R_1 \times I_1 = R_2 \times I_2 = \ldots = R_{n-1} \times I_{n-1} = R_n \times I_n = R_F \times I_F + V_{OS1}. \tag{7}$$

As can be seen from the discussion of expressions (2) and (5), expression (7) also implies that one of the output constant currents $I_{d1}$ to $I_{dm}$ can be set to its desired value by adjusting the resistance of the variable resistor $R_F$, and the remaining output constant currents can be set to their desired values by adjusting the resistances of the resistors $R_1$ to $R_n$. Since expression (7) is independent of the transistor characteristics, the output constant currents $I_{d1}$ to $I_{dm}$ are substantially free from the effect of manufacturing variations in the transistor characteristics, such as variations in the transistor threshold voltage.

The current source circuits 200, 600, and 700 shown in FIGS. 2, 6, and 7, respectively, may be used in various integrated circuits to provide output constant currents with high accuracy. In some embodiments, the current source circuits 200, 600, and 700 may be used to provide one or more output constant currents in integrated circuits that use the one or more output constant currents as reference currents. In other embodiments, the output constant currents generated by the current source circuits 200, 600, and 700 may be used as bias currents for regulator circuits, such as low dropout (LDO) regulators or the like.

Figure 8:
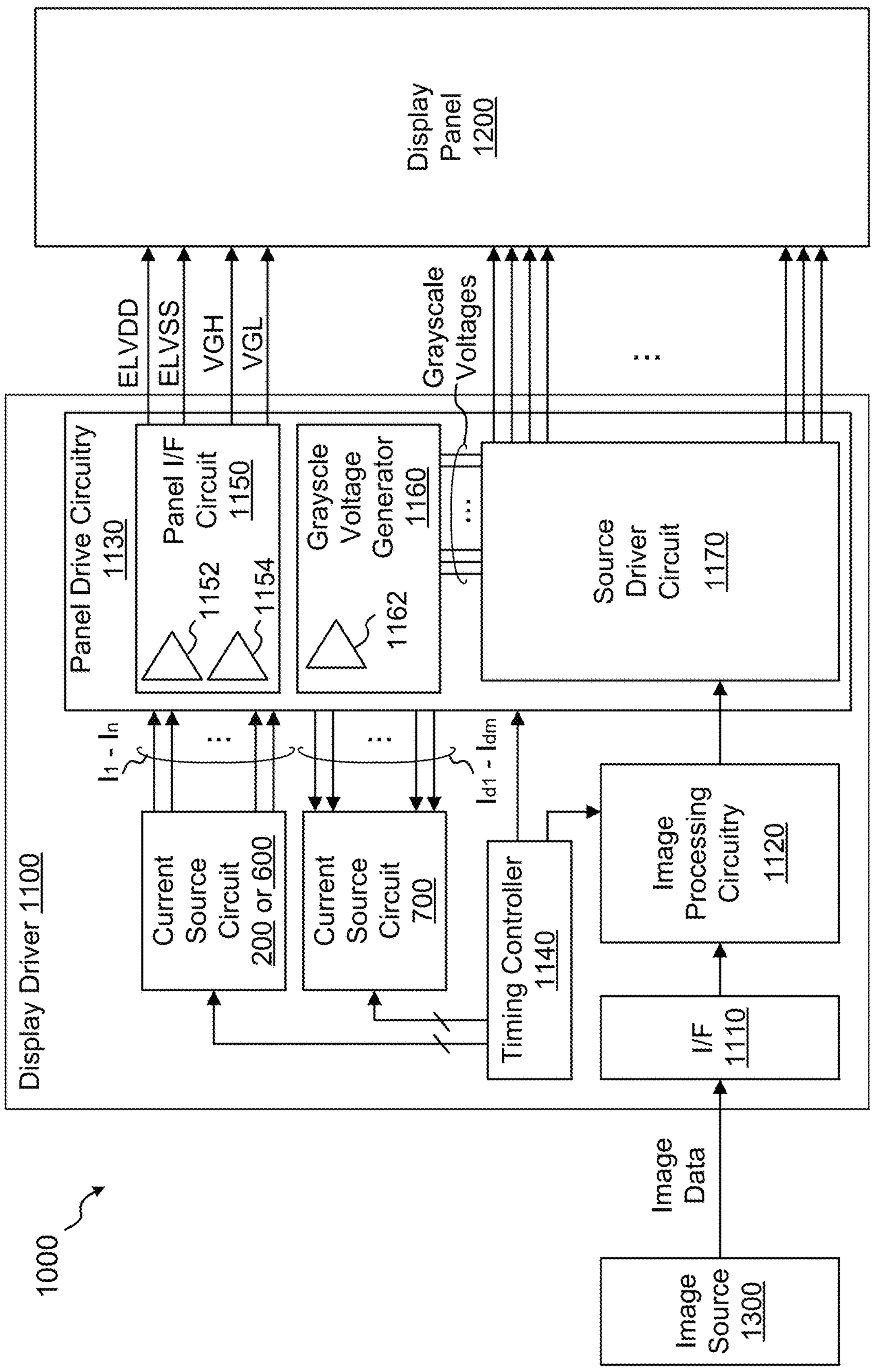
FIG. 8 shows an example configuration of a display device, according to one or more embodiments.

In some embodiments, one or more of the current source circuits 200, 600, and 700 may be integrated into a display driver configured to drive a display panel, such as, for example, an organic light emitting diode (OLED) display panel, a micro light emitting diode (μLED) display panel, or a liquid crystal display (LED) panel. FIG. 8 shows an example configuration of a display device 1000 using the current source circuit 200 or 600 and the current source circuit 700, according to one or more embodiments. In the shown embodiment, the display device 1000 includes a display driver 1100 and a display panel 1200. The display panel 1200 may be an OLED display panel, a μLED display panel, an LED panel, or any other type of display panel using a suitable display technology. The display driver 1100 is configured to receive image data from an image source 1300, the image data representing an image to be displayed on the display panel 1200. The image source 1300 may be, for example, any type of processor or controller configured to generate the image data, such as an application processor, a central processing unit (CPU), an electronic control unit (ECU), or a microcontroller unit (MCU). Other sources of image data are possible.

In the embodiment shown in FIG. 8, the current source circuit 200 or 600 and the current source circuit 700 are used in the display driver 1100 that includes an interface (I/F) circuit 1110, image processing circuitry 1120, panel drive circuitry 1130, and a timing controller 1140. The I/F circuit 1110 is configured to receive the image data from the image source 1300 and forward the image data to the image processing circuitry 1120. The image processing circuitry 1120 is configured to process the image data and provide the processed image data to the panel drive circuitry 1130. The panel drive circuitry 1130 is configured to drive the display panel 1200 using the output constant currents generated by the output constant currents $I_1$ to $I_n$ that are generated by the current source circuit 200 or 600 and/or the output constant currents $I_{d1}$ to $I_{dm}$ generated by the current source circuit 700. As discussed above in relation to FIGS. 2 and 6, the output constant currents $I_1$ to $I_n$ may be generated by the current generation subcircuits 210-1 to 210-*n* of the current source circuit 200 or 600 and the output constant currents $I_{d1}$ to $I_{dm}$ may be generated by the current generation subcircuits 710-1 to 710-*m* of the current source circuit 700.

In the embodiment shown in FIG. 8, the panel drive circuitry 1130 includes a panel interface (I/F) circuit 1150, a grayscale voltage generator 1160, and a source driver circuit 1170. The panel I/F circuit 1150 is configured to generate and provide controlled voltages to the display panel 1200 using the output constant currents $I_1$ to $I_n$ generated by the current source circuit 200 or 600 and/or the output constant currents $I_{d1}$ to $I_{dm}$ generated by the current source circuit 700. In some implementations, the panel I/F circuit 1150 may include a set of low dropout (LDO) regulators 1152 and 1154 (two shown) configured to generate regulated voltages using as bias currents a first set of output constant currents selected from the output constant currents $I_1$ to $I_n$ and $I_{d1}$ to $I_{dn}$. In such implementations, the panel I/F circuit 1150 may be configured to generate and provide the controlled voltages to the display panel 1200 using the regulated voltages generated by the LDO regulators 1152 and 1154. In one implementation, the controlled voltages provided to the display panel 1200 may include a gate high voltage VGH and a gate low voltage VGL, which are used to drive the gate lines (also referred to as the scan lines) of the display panel 1200. In embodiments where the display panel 1200 is an OLED display panel, the controlled voltages may further include a high-side power source voltage ELVDD and a low-side power source voltage ELVSS which are used to drive OLED pixels in the OLED display panel.

The grayscale voltage generator 1160 is configured to generate and provide a set of grayscale voltages to the source driver circuit 1170, which is configured to generate data voltages based on the processed image data received from the image processing circuitry 1120. In one implementation, the processed image data may include a gray level value for each pixel of the display panel 1200, and the source driver circuit 1170 may be configured to drive each pixel with a data voltage selected from the set of grayscale voltages based on the gray level value for that pixel. In some implementations, the grayscale voltage generator 1160 may include a set of LDO regulators 1162 (one shown) configured to generate regulated voltages using as bias currents a second set of output constant currents selected from the output constant currents $I_1$ to $I_n$ and $I_{d1}$ to Ian. In such implementations, the grayscale voltage generator 1160 may be configured to generate and provide the set of grayscale voltages to the source driver circuit 1170 using the regulated voltages generated by the LDO regulators 1162.

The timing controller 1140 is configured to provide timing control for the entire display driver 1100. The timing controller 1140 may be configured to provide timing control signals (e.g., a horizontal synchronization signal, a vertical synchronization signal, and a dot signal) to the image processing circuitry 1120 and the panel drive circuitry 1130. The timing controller 1140 may further be configured to generate a first set of control signals indicative of the turn-on timing of the switches SW1*a* to SWna and SW1*b* to SWnb of the current source circuit 200 or 600 and a second set of control signals indicative of the turn-on timing of the switches SW1*a* to SWma and SW1*b* to SWmb of the current source circuit 700.

Figure 9:
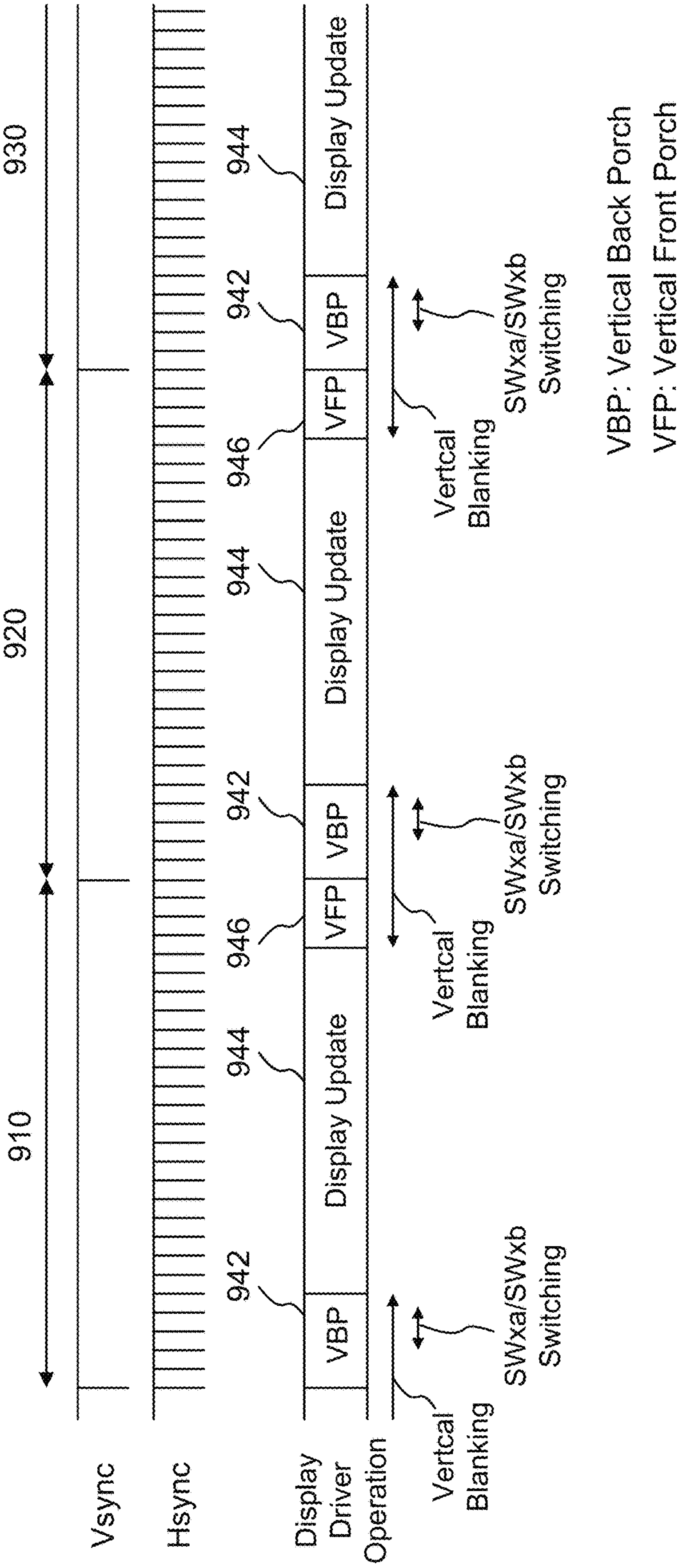
FIG. 9 is a timing diagram showing an example operation of the display device shown in FIG. 8, according to one or more embodiments.

FIG. 9 is a timing diagram showing an example operation of the display device 1000, according to one or more embodiments. In FIG. 9 and the following description, the switches SW1*a* to SWna of the current source circuit 200 or 600 and the switches SW1*a* to SWma of the current source circuit 700 are collectively referred to as the switches SWxa, and the switches SW1*b* to SWnb of the current source circuit 200 or 600 and the switches SW1*b* to SWmb of the current source circuit 700 are collectively referred to as the switches SWxb. In FIG. 9, numerals 910, 920, and 930 denote a series of vertical synchronization periods. In one implementation, each vertical synchronization period is defined by the assertion timing of a vertical synchronization signal Vsync generated in the display driver 1100 (e.g., by the timing controller 1140 shown in FIG. 8). Each vertical synchronization period includes a series of horizontal synchronization periods each defined by the assertion timing of a horizontal synchronization signal Hsync generated in the display driver 1100 (e.g., by the timing controller 1140 shown in FIG. 8).

Each of the vertical synchronization periods 910, 920, and 930 includes a vertical back porch (VBP) period 942, a display update period 944, and a vertical front porch (VFP) period 946. All of the pixels of the display panel 1200 are driven with associated data voltages during the display update period 944 of each vertical synchronization period. Each vertical blanking period, during which no pixels are driven with data voltages, includes a VFP period 946 and a VBP period 942 that follows the VFP period 946.

In one or more embodiments, in each vertical blanking period, the switches SWxa may be turned on (e.g., closed) in turn and the switches SWxb may be turned on (e.g., closed) in turn (e.g. as shown in FIG. 5A or 5B). In FIG. 9, the periods of time during which the switches SWxa and SWxb are turned on in turn are indicated by the double-headed arrows "SWxa/SWxb Switching". In one implementation, the switches SWxa and SWxb may be turned on in turn during a portion of each vertical blanking period, e.g., a portion of each VBP period 942. In other implementations, the switches SWxa and SWxb may be turned on in turn during a portion of each VFP period 946 or during the entirety of each vertical blanking period. It should be noted that the switches SWxa and SWxb are switched between the on and off states (e.g., closed and open, respectively) only during the vertical blanking periods, and the switches SWxa and SWxb remain turned off (e.g., open) during the display update periods. This allows the pixels of the display panel 1200 to be driven with the data voltages without being affected by the noise potentially generated by the switching of the switches SWxa and SWxb, effectively improving the image quality of the image displayed on the display panel 1200.

Figure 10:
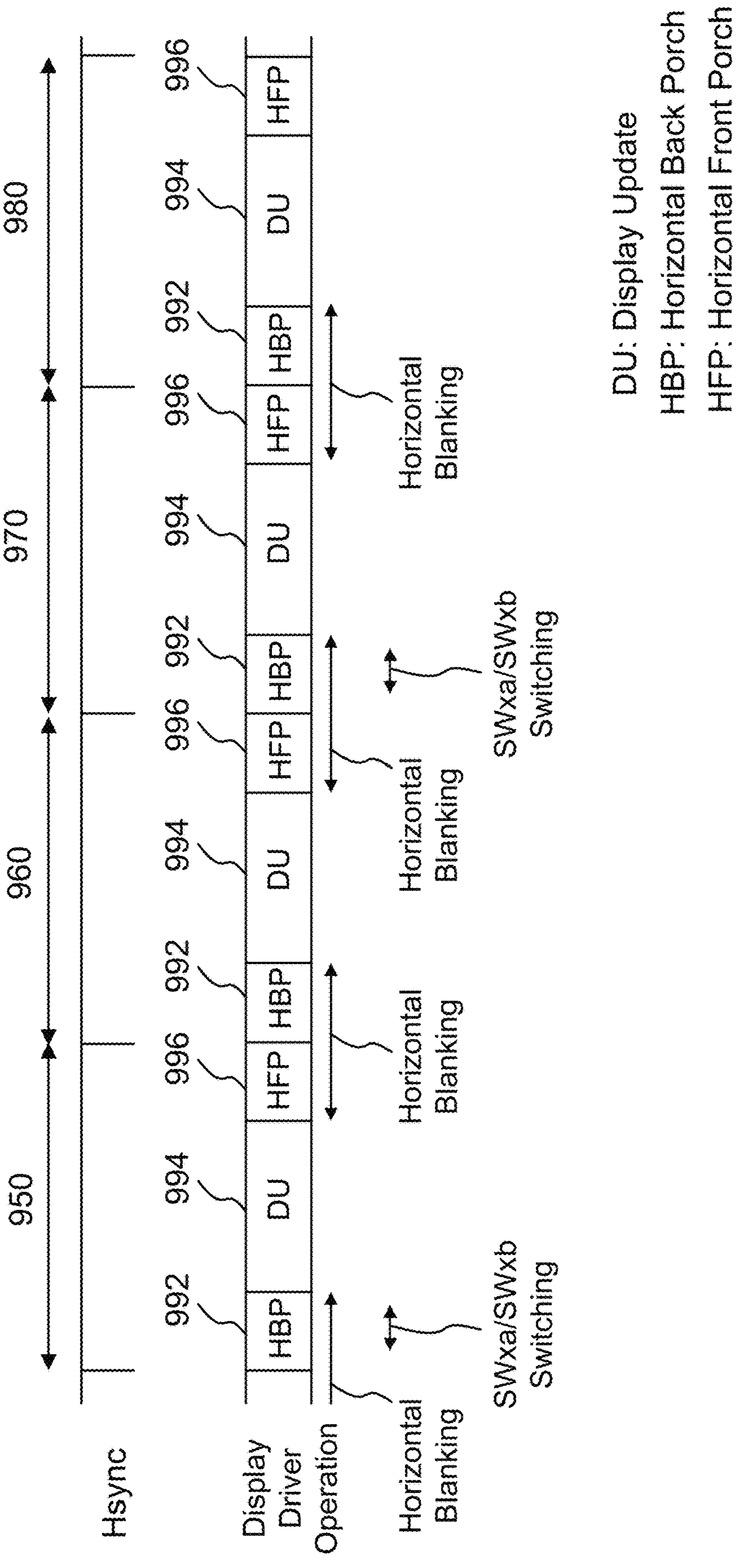
FIG. 10 is a timing diagram showing another example operation of the display device shown in FIG. 8, according to one or more embodiments.

FIG. 10 is a timing diagram showing another example operation of the display device 1000, according to one or more embodiments. In FIG. 10, numerals 950, 960, 970, and 980 denote a series of horizontal synchronization periods. Each of the horizontal synchronization periods 950, 960, 970, and 980 includes a horizontal back porch (HBP) period 992, a display update (DU) period 994, and a horizontal front porch (HFP) period 996. Pixels of one horizontal line of the display panel 1200 are driven with associated data voltages during the display update period 994 of each horizontal synchronization period, wherein the horizontal line referred to herein is a set of pixels coupled to the same gate line (or scan line) of the display panel 1200. Each horizontal blanking period, during which no pixels are driven with data voltages, includes an HFP period 996 and an HBP period 992 following the HFP period 996.

In one or more embodiments, for example as shown in FIG. 5A or 5B, the switches SWxa may be turned on (e.g., closed) in turn every predetermined number of horizontal blanking periods and the switches SWxb may also be turned on (e.g., closed) in turn every the predetermined number of horizontal blanking periods. In FIG. 10, the periods of time during which the switches SWxa and SWxb are turned on in turn are indicated by the double-headed arrows "SWxa/SWxb Switching". In the embodiment shown in FIG. 10, the switches SWxa and SWxb are turned on in turn once every two horizontal blanking periods. More specifically, FIG. 10 shows that the switches SWxa and SWxb are turned on in turn once during a portion of each HBP period 992 of every two horizontal synchronization periods. Alternatively, the switches SWxa and SWxb may be turned on in turn once during a portion of each HFP period 996 of every predetermined number of horizontal synchronization periods, e.g., the switches SWxa and SWxb are turned on in turn once during a portion of each HBP period 992 of every two horizontal synchronization periods. In still other embodiments, the switches SWxa and SWxb are turned on in turn once each horizontal blanking period, e.g., during the HBP period 992 or the HFP period 996 of each horizontal blanking period. It should be noted that the switches SWxa and SWxb are switched between the on and off states (e.g., closed and open, respectively) only during the horizontal blanking periods, and the switches SWxa and SWxb remain turned off (e.g., open) during the display update periods 994. This allows the pixels of the display panel 1200 to be driven with the data voltages without being affected by the noise potentially generated by the switching of the switches SWxa and SWxb, effectively improving the image quality of the image displayed on the display panel 1200.

Figure 11:
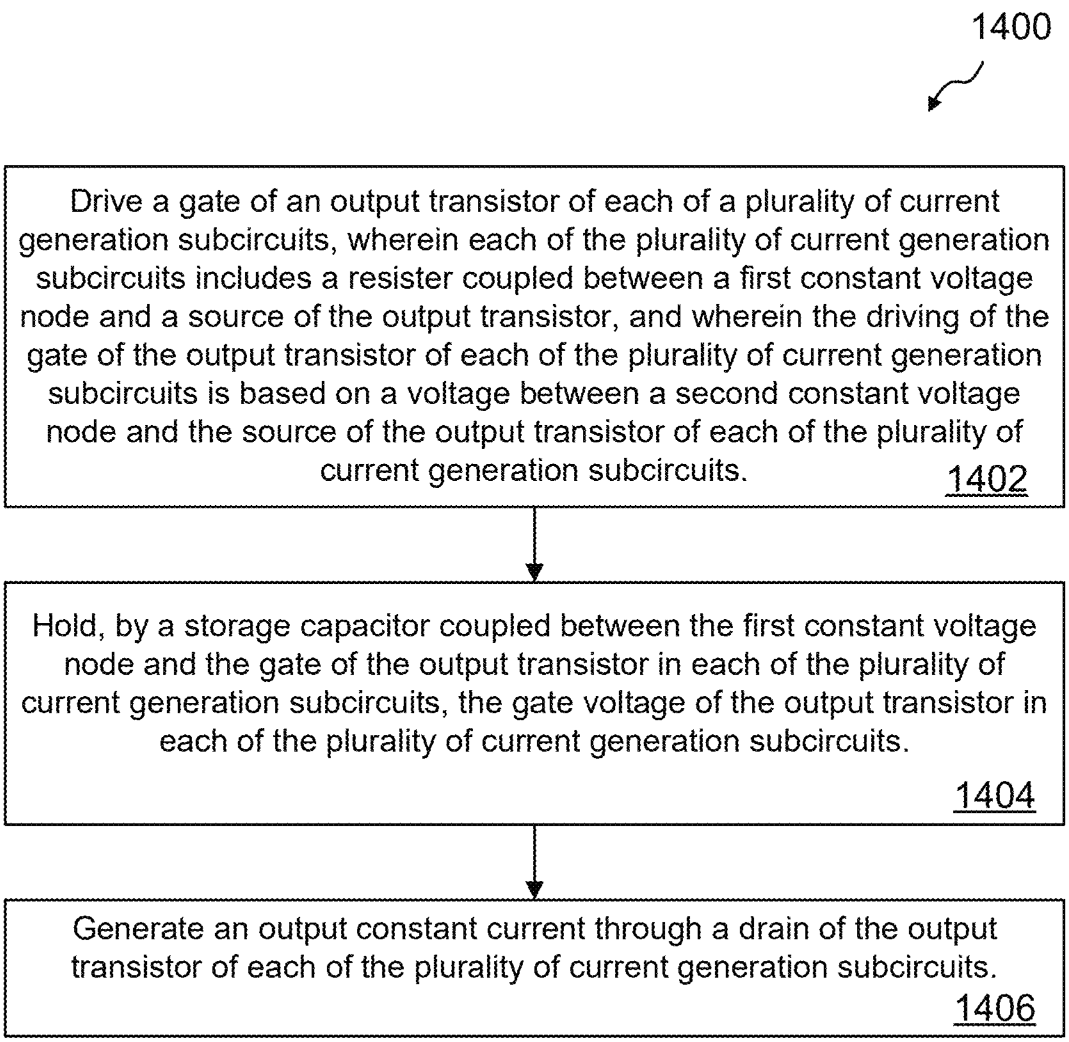
FIG. 11 is a flowchart showing an exemplary process for operating a current source circuit, according to one or more embodiments.

FIG. 11 is a flowchart showing an exemplary process 1400 for operating a current source circuit, according to one or more embodiments. The process 1400 may be performed by any of the current source circuits 200, 600, and 700 shown in FIGS. 2, 6, and 7. However, it will be recognized that a current source circuit that includes additional and/or fewer components as shown in FIGS. 2, 6, and 7 may be used to perform the process 1400, that any of the following steps may be performed in any suitable order, and that the process 1400 may be performed in any suitable environment.

The process 1400 includes driving a gate of an output transistor (e.g., the PMOS transistors MP1 to MPn shown in FIGS. 2 and 6 and the NMOS transistors MN1 to MNm shown in FIG. 7) of each of a plurality of current generation subcircuits (e.g., the current generation subcircuits 210-1 to 210-$n$ shown in FIGS. 2 and 6 and the current generation subcircuits 710-1 to 710-$m$ shown in FIG. 7) in step 1402. Each of the plurality of current generation subcircuits includes a resistor (e.g., the resistors $R_1$ to $R_n$ shown in FIGS. 2 and 6 and the resistors $R_1$ to $R_m$ shown in FIG. 7) coupled between a first constant voltage node (e.g., the first constant voltage nodes 240 and 740 shown in FIGS. 2, 6, and 7) and a source of the output transistor. Driving the gate of the output transistor of each of the plurality of current generation subcircuits is based on a voltage between a second constant voltage node (e.g., the second constant voltage nodes 250 and 750 shown in FIGS. 2, 6, and 7) and the source of the output transistor of each of the plurality of current generation subcircuits. The process 1400 further includes holding, by a storage capacitor (e.g., the storage capacitors $C_1$ to $C_n$ shown in FIGS. 2 and 6 and the storage capacitors $C_1$ to Cm shown in FIG. 7), the gate voltage of the output transistor in each of the plurality of current generation subcircuits in step 1404. The storage capacitor is coupled between the first constant voltage node and the gate of the output transistor in each of the plurality of current generation subcircuits. The process 1400 further includes generating an output constant current through a drain of the output transistor of each of the plurality of current generation subcircuits in step 1406.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein. Variations of those exemplary embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A current source circuit, comprising:

a plurality of current generation subcircuits, wherein each of the plurality of current generation subcircuits comprises:

an output transistor comprising a drain through which an output constant current is generated;

a resistor coupled between a first constant voltage node and a source of the output transistor; and a storage capacitor coupled between the first constant voltage node and a gate of the output transistor; and a first operational amplifier comprising:

a first input coupled to a second constant voltage node;

a second input selectively couplable to the source of the output transistor; and an output selectively couplable to the gate of the output transistor.

2. The current source circuit of claim 1, further comprising a variable register coupled between the first constant voltage node and the second constant voltage node.

3. The current source circuit of claim 2, further comprising a constant current source configured to generate a constant current through the variable register.

4. The current source circuit of claim 1, wherein the first constant voltage node is coupled to a power node; and wherein the output transistor comprises a p-channel metal insulator semiconductor field effect transistor (MISFET).

5. The current source circuit of claim 1, further comprising:

a second operational amplifier comprising:

a first input coupled to a third constant voltage node;

a second input; and an output coupled to the first constant voltage node and the second input of the second operational amplifier; and a variable resistor coupled between the second constant voltage node and the third constant voltage node.

6. The current source circuit of claim 5, further comprising a constant current source configured to generate a constant current through the variable resistor.

7. The current source circuit of claim 5, wherein a voltage level at the third constant voltage node is greater than a voltage level at the second constant voltage node, and wherein the output transistor comprises a p-channel MISFET.

8. The current source circuit of claim 1, wherein the first constant voltage node is coupled to a grounded node; and wherein the output transistor comprises an n-channel MISFET.

9. The current source circuit of claim 1, wherein the second input of the first operational amplifier of one of the plurality of current generation subcircuits is electrically connected to the source of the output transistor of the one of the plurality of current generation subcircuits during a first period of time, wherein the output of the first operational amplifier of the one of the plurality of current generation subcircuits is electrically connected to the gate of the output transistor during a second period of time, and wherein the second period of time begins after a start of the first period of time and ends before an end of the first period of time.

10. The current source circuit of claim 1, wherein each of the plurality of current generation subcircuits further comprises a first switch coupled between the output of the first operational amplifier and the gate of the output transistor.

11. The current source circuit of claim 10, wherein the first switches of the plurality of current generation subcircuits are configured to turn on in turn.

12. The current source circuit of claim 10, wherein each of the plurality of current generation subcircuits further comprises a second switch coupled between the source of the output transistor and the second input of the first operational amplifier.

13. The current source circuit of claim 12, wherein, in each of the plurality of current generation subcircuits, the first switch and the second switch are configured to turn on at a same time.

14. The current source circuit of claim 12, wherein the second switches of the plurality of current generation subcircuits are configured to turn on in turn.

15. The current source circuit of claim 12, wherein the first switch and the second switch of each of the plurality of current generation subcircuits are configured to:

switch between an on state and an off state in a blanking period of a display device that comprises the current source circuit; and remain in the off state during a display update period.

16. A display driver, comprising:

a current source circuit comprising:

a plurality of current generation subcircuits, wherein each of the plurality of current generation subcircuits comprises:

an output transistor comprising a drain through which an output constant current is generated;

a resistor coupled between a first constant voltage node and a source of the output transistor; and a storage capacitor coupled between the first constant voltage node and a gate of the output transistor; and a first operational amplifier comprising:

a first input coupled to a second constant voltage node;

a second input selectively couplable to the source of the output transistor; and an output selectively couplable to the gate of the output transistor; and panel drive circuitry configured to drive a display panel using the output constant currents generated by the plurality of current generation subcircuits.

17. The display driver of claim 16, wherein each of the plurality of current generation subcircuits further comprises:

a first switch coupled between the output of the first operational amplifier and the gate of the output transistor; and a second switch coupled between the source of the output transistor and the second input of the first operational amplifier.

18. The display driver of claim 17, wherein the first switch and the second switch of each of the plurality of current generation subcircuits are configured to:

switch between an on state and an off state in a blanking period of a display device that comprises the display driver and the display panel; and remain in the off state during a display update period.

19. A method of operating a current source circuit comprising a plurality of current generation subcircuits, the method comprising:

driving a gate of an output transistor of each of the plurality of current generation subcircuits, wherein each of the plurality of current generation subcircuits comprises a resistor coupled between a first constant voltage node and a source of the output transistor, and wherein the driving of the gate of the output transistor of each of the plurality of current generation subcircuits is based on a voltage between a second constant voltage node and the source of the output transistor of each of the plurality of current generation subcircuits;

holding, by a storage capacitor coupled between the first constant voltage node and the gate of the output transistor in each of the plurality of current generation subcircuits, a gate voltage of the output transistor in each of the plurality of current generation subcircuits; and generating an output constant current through a drain of the output transistor of each of the plurality of current generation subcircuits.

20. The method of claim 19, wherein the driving of the gate of the output transistor of one of the plurality of current generation subcircuits is performed by an operation amplifier during a first period of time, and wherein the method further comprises:

electrically disconnecting an input of the operational amplifier from the source of the output transistor of the one of the plurality of current generation subcircuits during a second period of time which does not overlap the first period of time.

* * * * *